(12) United States Patent
Acker et al.

(10) Patent No.: US 7,871,563 B2
(45) Date of Patent: Jan. 18, 2011

(54) PROCESS FOR THE REFURBISHING OF A SPUTTERING TARGET

(75) Inventors: Robert Acker, Poughquag, NY (US); Adrish Ganguly, Danbury, CT (US); Matthew T. Willson, New Millford, CT (US)

(73) Assignee: Williams Advanced Materials, Inc., Buffalo, NY (US)

( * ) Notice: Subject to any disclaimer, the term of this patent is extended or adjusted under 35 U.S.C. 154(b) by 0 days.

(21) Appl. No.: 12/173,410

(22) Filed: Jul. 15, 2008

(65) Prior Publication Data

US 2009/0022616 A1    Jan. 22, 2009

Related U.S. Application Data

(60) Provisional application No. 60/950,264, filed on Jul. 17, 2007.

(51) Int. Cl.
C22C 1/04 (2006.01)
B22F 9/00 (2006.01)

(52) U.S. Cl. ................. 419/48; 419/8; 425/78

(58) Field of Classification Search .......... 419/48, 419/8; 425/78
See application file for complete search history.

(56) References Cited

U.S. PATENT DOCUMENTS

| | | | |
|---|---|---|---|
| 4,954,170 A | 9/1990 | Fey | |
| 6,042,777 A | 3/2000 | Lo | |
| 6,183,613 B1 * | 2/2001 | Gilman et al. | 204/298.12 |
| 6,313,392 B1 | 11/2001 | Sato | |
| 6,582,641 B1 | 6/2003 | Lo | |
| 6,744,025 B2 * | 6/2004 | Vilo | 219/686 |
| 7,175,802 B2 | 2/2007 | Sandlin | |
| 2006/0021870 A1 * | 2/2006 | Tsai et al. | 204/192.13 |
| 2007/0189916 A1 | 8/2007 | Zhang | |

FOREIGN PATENT DOCUMENTS

JP    2004/225091    8/2004

OTHER PUBLICATIONS

International Searching Authority; International Search Report and Written Opinion in PCT/US08/70109; Oct. 22, 2008.
Sumitomo Metal Mining Co.; Translation of JP2004-225091; Aug. 12, 2004.
Suárez et al., "Modeling of Grain Growth During Arc Welding of High Strength Low Alloy Steels", Materials Characterization, 1992, pp. 3-13, vol. 28.
Ahmad et al., "Microstructure evolution in the electron beam treated surface of a Ni-base single crystal", Journal of Alloys and Compounds, 2006, pp. 97-101, vol. 422, Elsevier B.V.
Ganguly, et al., "Interdiffusion Between $Ti_3SiC_2$-$Ti_3GeC_2$ and $Ti_2AlC$-$Nb_2AlC$ Diffusion Couples", J. Am. Ceram. Soc., 2007, pp. 2200-2204, vol. 90, No. 7, The American Ceramic Society.

* cited by examiner

*Primary Examiner*—Emily M Le
*Assistant Examiner*—Rebecca Lee
(74) *Attorney, Agent, or Firm*—Hiscock & Barclay, LLP (57) ABSTRACT

Disclosed in this specification is a process for refurbishing a spent sputtering target. The process includes the step of applying sufficient heat and axial force to the filled sputtering target to hot press the filled sputtering target such that the powdered metal fuses with the un-sputtered metal, producing a refurbished target. The process may be used to refurbish precious metal targets, such as ruthenium targets.

13 Claims, 8 Drawing Sheets

FIG. 7B x35 - no interface visible

FIG. 7A x10 - interface visible

PROCESS FOR THE REFURBISHING OF A SPUTTERING TARGET

FIELD OF THE INVENTION

This invention relates, in one embodiment, to a process for refurbishing a spent sputtering target by hot pressing.

BACKGROUND OF THE INVENTION

Sputtering is a process used to deposit a thin layer of material onto a substrate. Such thin layers are useful in certain electronic equipment, in the production of some optical storage media (such as compact discs) and in a variety of other applications. During the sputtering process the substrate and a target are placed in a deposition chamber. The target typically a metal or metal alloy, is constructed of the material to be sputtered. For example, if one wishes to deposit ruthenium as the intermediate layer or Co—Cr—Pt—B-oxide (s) as the magnetic layer, then a target made of corresponding material is used. The target and substrate are placed in proximity to one another within the chamber and the target is bombarded with an ion beam. The high energy ions cause a portion of the target to dislodge and be re-deposited on the substrate. Unfortunately, the target is not uniformly consumed. The metal is more easily dislodged from the target in those regions where the ion beam is most intense. This generates localized depleted regions, where the target eventually wears thin. The lifetime of the target is determined by the resulting thickness of the target at its thinnest point. Due to the non-uniform consumption of the metal, the target often reaches the end of its useful life after only a fraction (approximately 30%) of the metal has been consumed. The un-sputtered metal (approximately 70%) is not used.

One method for refurbishing a sputtering target that does not pulverize the spent target is disclosed in U.S. Pat. No. 7,175,802 to Sandlin et al., entitled "Refurbishing Spent Sputtering Targets." Sadlin et al. teach a method for refurbishing a sputtering target wherein the target and powdered metal are placed within a hot isostatic pressing (HIP) container. Hot isostatic pressing (HIP), also referred to as inert gas hot pressing (IGHP), is a technique that subjects a target to high temperature (typically 480-1300° C. depending on the metal) and high, isostatic pressure (typically on the order of 100-200 MPa) under an inert atmosphere (typically argon). Isostatic pressure is pressure that is uniformly applied from all directions. After the HIP process is complete, a fused block of metal has formed around the target. The target is separated from the fused block by "sawing and milling operations." In addition, the sawing and milling operations which are required to isolate the refurbished target result in loss of material.

SUMMARY OF THE INVENTION

A spent sputtering target may be refurbished by re-processing the un-sputtered metal, combining it with fresh metal powder, and reforming a new target. During such re-processing, a certain percentage of the un-sputtered metal is lost. For example, grinding of the un-sputtered metal to produce re-processed powder generates dust, which is often lost to the environment.

Great care must be taken during refurbishing to produce a homogeneous target. If the spent target becomes heterogeneous the resulting layer would likewise be heterogeneous, which is typically undesirable. Solid state diffusion between the metal powder (e.g. powered replacement metal) and a solid material (e.g. a spent target) tends to form a distinct interface between the two materials with anomalous grain growths that introduce heterogeneity. For this reason, the un-sputtered target is often pulverized by crushing or refining, mixed with fresh metal powder, and a new target is processed. Although this produces a homogenous target, the very steps that promote homogeneity (e.g. crushing or refining to form powders) also increase the amount of material which is lost.

There is a need for a process for refurbishing a sputtering target that minimizes the number of re-processing steps and thus reduces the amount of material lost during re-processing.

The invention comprises, in one form thereof a process for refurbishing a spent sputtering target comprising the steps of receiving a spent sputtering target, removing the surface impurities by a combination of chemical treatment followed by blasting, disposing the spent target in a hot press die, pouring of fresh metal powder to account for the depleted regions of the target, inserting a barrier layer in between the top punch of the hot press die and the metal powder bed and applying an axial force such that the powdered metal sinters and forms a solid state diffusion bond with the target, producing a refurbished homogenous target.

The invention also pertains to a unique die for performing the aforementioned refurbishing process.

An advantage of the present invention is the design of the hot press die, the dimensions of which are optimized in such a way that even at significantly high uniaxial compressive pressure the radial stress on the die is reduced to a great extent.

A further advantage of the present invention is that the refurbished targets do not need to be isolated from a fused block of metal by sawing and milling steps. Such additional steps are undesirable, as they may result in loss of costly material.

BRIEF DESCRIPTION OF THE DRAWINGS

The present invention is disclosed with reference to the accompanying drawings, wherein.

Corresponding reference characters indicate corresponding parts throughout the several views. The examples set out herein illustrate several embodiments of the invention but should not be construed as limiting the scope of the invention in any manner.

DETAILED DESCRIPTION OF A PREFERRED EMBODIMENT

Figure 1:
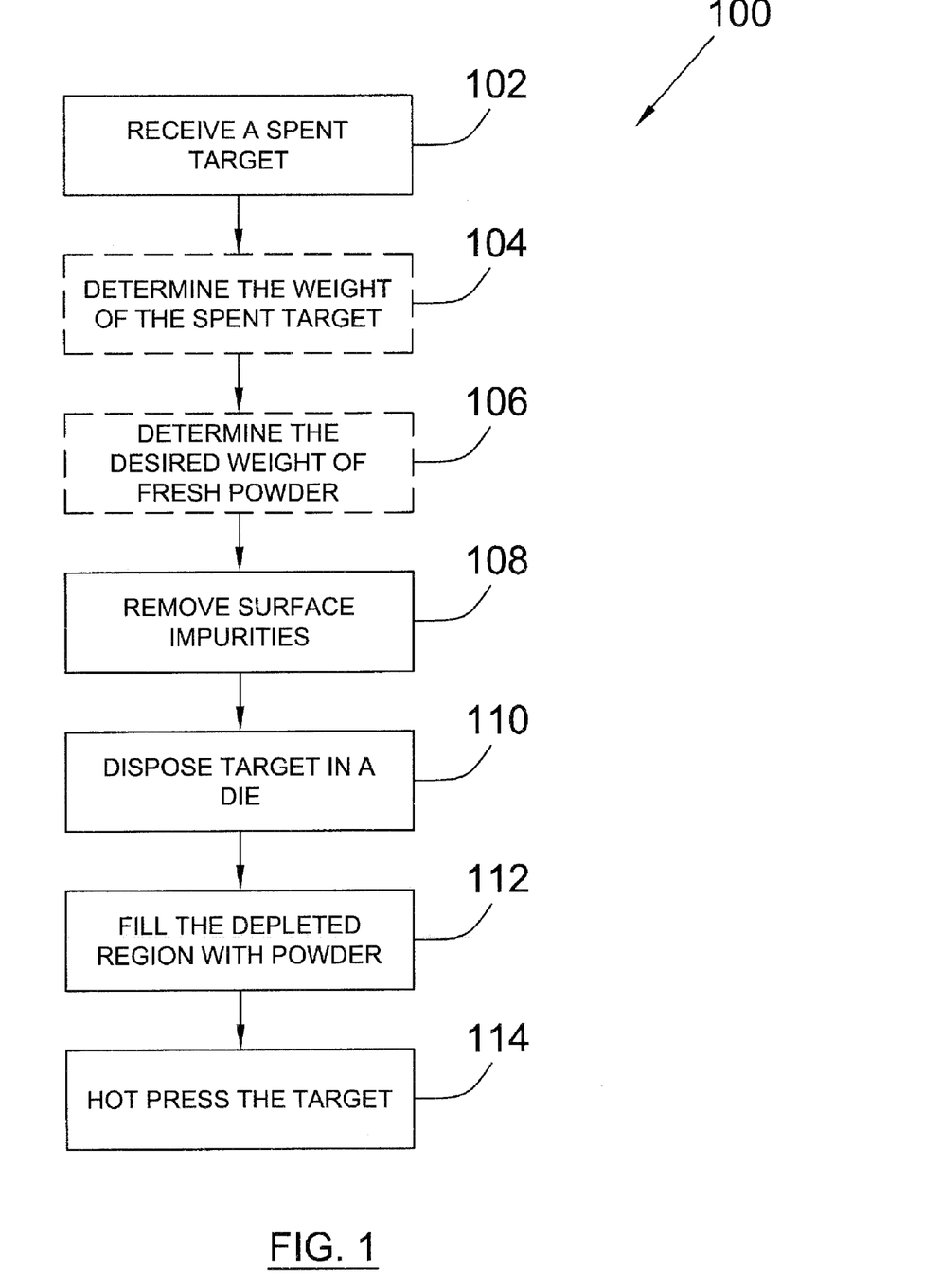
FIG. 1 is a flow diagram of one process of the invention.

Referring to FIG. 1, process 100 is initiated by the execution of step 102, wherein a spent sputtering target is received. The target may be received by, for example, a target recycling facility. One such target is illustrated in FIG. 2A.

Figure 2A:
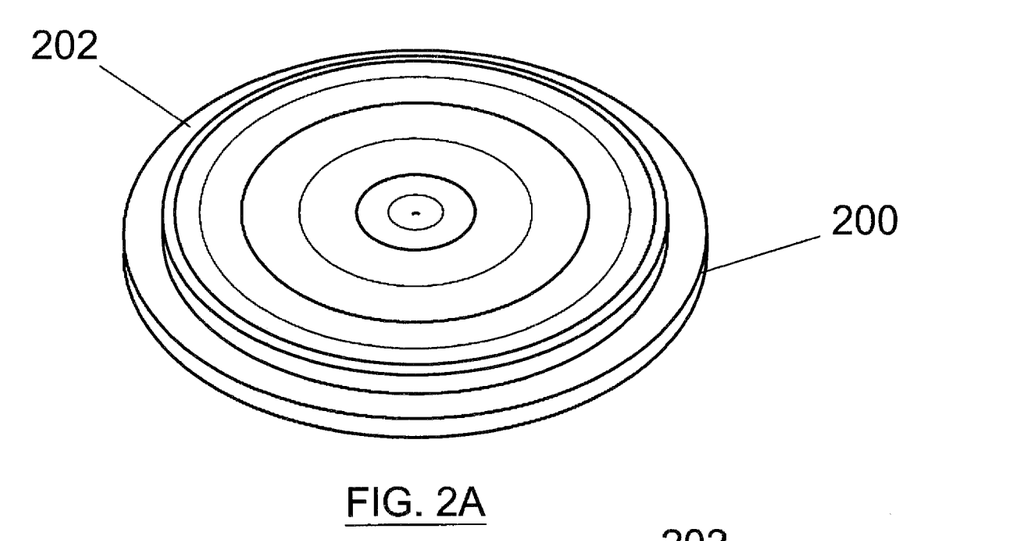
FIGS. 2A, 2B and 2C show various sputtering targets for use with the present invention.
Figure 2B:
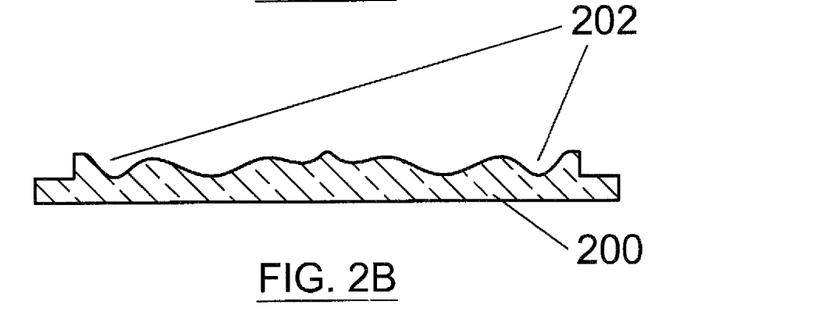
Figure 2C:
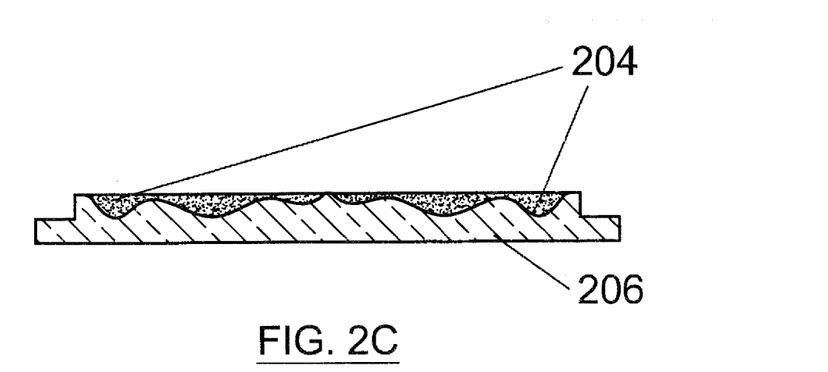

FIGS. 2A, 2B and 2C are illustrations of sputtering targets at various stages of process 100. FIG. 2A depicts a spent sputtering target 200 that has previously been used to perform the sputtering process. FIG. 2B is a side view of spent sputtering target 200. FIG. 2B more clearly illustrates that spent sputtering target has depleted regions 202. In the embodiment depicted in FIG. 2A, the spent sputtering target 20 is circular and the depleted regions 202 are also circular. The geometry of the depleted regions 202 is a function of the sputtering process—geometries other than those shown in FIG. 2A may also be used. Similarly, the disc shape of spent sputtering target 202 is merely an example of one possible target. Many other suitable shapes would be apparent to one skilled in the art after benefiting from reading this specification. Such shapes are considered within the scope of this invention. For example, a target may have a disc shape with a diameter of 180 millimeters and a thickness of 7 millimeters. In one embodiment, not shown, the sputtering target is further comprised of a backing plate (i.e. support material).

Referring again to FIG. 1, once the spent sputtering target has been received in step 102 then step 104, which is optional but preferred, is executed. In step 104, the actual weight of the spent target is identified. In step 106, which is also optional, the weight of fresh powder that is desired is determined. For example, the desired weight of the recycled target may be X grams (e.g. 10 grams), but the actual weight of the spent target is X-Y grams (e.g. 9 grams). This indicates an additional Y grams (e.g. 1 gram) of metal should be added to refurbished the target.

Sputtered targets often contain surface impurities which can be organic or metallic in nature. The source of impurities can be, for example, a shield kit of the sputtering chamber or the bonding adhesive if the target is bonded to a backing plate. Step 108 ensures removal of possible surface impurities from the surface of the target by conventional wet and dry cleaning procedures. The effectiveness of the cleaning procedure is confirmed by characterizing the cleaned surface using a high resolution Scanning Electron Microscope equipped with energy dispersive spectroscope for the metallic impurities and a Raman Spectroscope for organic impurities.

Figure 3A:
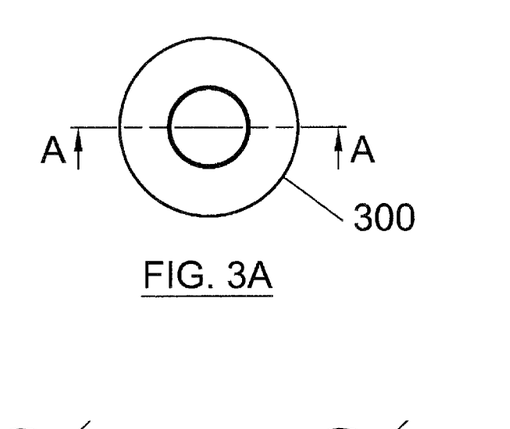
FIGS. 3A and 3B depict a die for use with the instant invention.
Figure 3B:
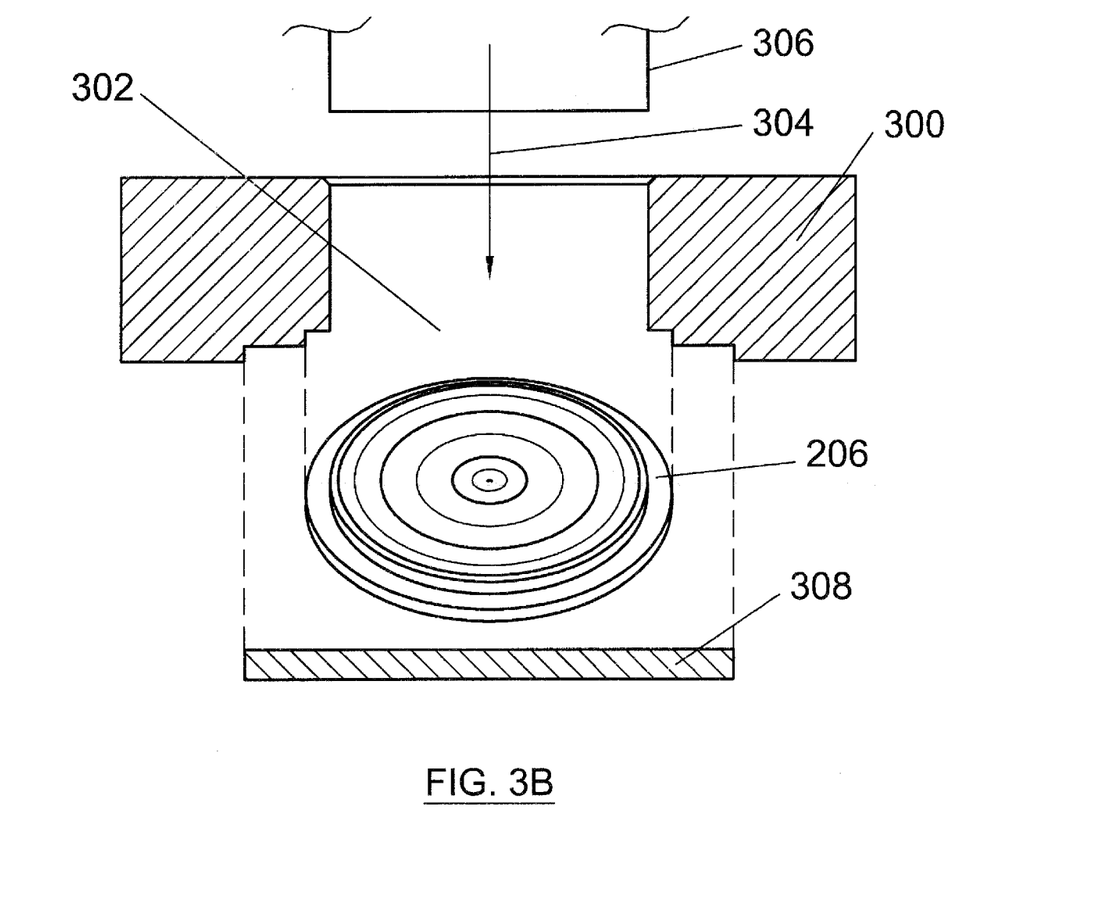

In step 110, the spent target is disposed within a die. Reference may be had to FIGS. 3A and 3B. FIG. 3A is a top view of die 300. FIG. 3B is a side view of the same die 300. Die 300 is configured to mate with sputtering target 206 such that target 206 is disposed within cavity 302. When a sputtering target with a customized shape is received, a die may be specially fabricated to securely mate with such a target. In this manner many target shapes and configurations may be accommodated. Any undesirable oxidizing gases, such as atmospheric oxygen, may be purged by passing an inert gas (such as argon) over the assembly. In some embodiments, a molybdenum foil (not shown) is inserted between press 306 and target 206. Such a foil helps to prevent diffusion of material (such as carbon atoms from the graphite) from the press 306 when the axial force is applied. The die may be sealed by pressing it against a surface, such as surface 308.

In step 112 is executed, the depleted regions (see depleted regions 202 of FIG. 2B) are then filled with a powder that corresponds to the composition of the spent target. Reference may be had to FIG. 2B. For example, if the spent sputtering target 200 is comprised of ruthenium, then the depleted regions 202 are filled with ruthenium powder 204, thus producing filled sputtering target 206. Many suitable metals, metal-alloys, and combination of metal-alloys and oxide ceramics may be used. Examples of material suitable for use with the present invention may include, but not limited to ruthenium and its alloys, rhodium and its alloys, Co—Cr—Pt—B-oxides, where oxide combination may include but are not limited to early transition metals and/or non-metals. The filling step 112 may occur either before the die is disposed in the target (step 110) or, as illustrated in FIG. 1, after step 110.

In one embodiment, the metal/metal-alloy is free of both oxides and carbides. The virgin powder may be of various morphologies, provided the particulates have a suitable particle size and purity. In one aspect, the particle morphology is fibrous. In such an embodiment, acicular or round morphologies are avoided. One suitable virgin powder has a tap density of from about 2.5 to about 3.2 grams per cubic centimeter and the particles have a surface area of from about 0.1 to about 0.4 square meters per gram. The powder has a defined particle size distribution such that at least 90% of the particles are smaller than 120 microns, at least 50% of the particles are smaller than 75 microns, and at least 10% of the particles are smaller than 20 microns. In one embodiment, the particle size distribution is not bi-modal. The powder is preferably at least 99.95% pure based on the following elemental impurities: Ag, Al, Co, Cr, Cu, Fe, Mg, Mo, Ni, Si, Sn, Ti, Zn and Zr. The combined concentration of the aforementioned elements is preferably less than 500 ppm.

Figure 8:
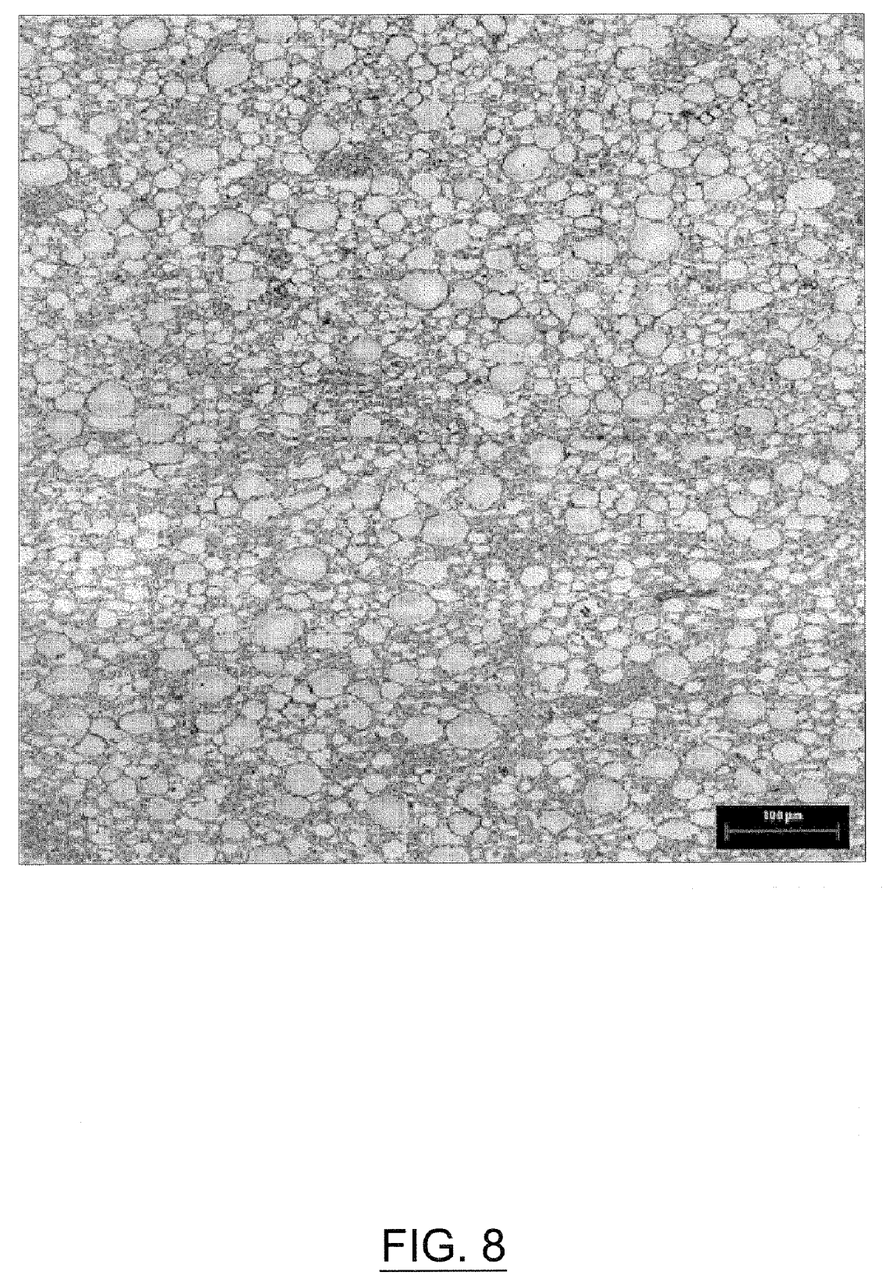
FIG. 8 depicts another profile of a refurbished target.

In case of a combination of metal-alloys and oxides; the oxide (s) must be distributed homogeneously throughout in the final microstructure (particle size <5 microns) being in equilibrium with the surrounding gas atomized metal-alloy counter part (particle size <45 microns). Typical microstructure of a refurbished composition is shown in FIG. 8. The starting powder is preferably at least 99.9% pure based on the following elemental impurities: Ag, Al, Co, Cr, Cu, Fe, Mg, Mo, Ni, Si, Sn, Ti, Zn and Zr.

In step 114, and with reference to FIG. 3B, once filled sputtering target 206 is securely disposed within cavity 302, the resulting assembly may be hot pressed. During such hot pressing step 114 the filled sputtering target is heated to a specified temperature while applying axial pressure along the direction of arrow 304. In the embodiment shown in FIG. 3B, press 306 supplies the axial force. In another embodiment, not shown, the axial pressure is applied along a direction opposite arrow 304. In both embodiments, the axial force is applied in a direction perpendicular to the top surface of the filled sputtering target. Such a hot pressing technique is distinguished from hot isostatic pressing by the direction of force. Isostatic pressure, which is omnidirectional, subjects the target to a drastically different pressurized environment than axial pressure. The results of one technique cannot be extrapolated to the other. The inventors have discovered certain conditions that make it possible to produce homogeneous, refurbished targets using hot, non-isostatic pressing with significantly lower pressures than prior art refurbishing techniques. Advantageously, the instant process makes subsequent sawing or milling of the refurbished target unnecessary.

When applying uni-axial pressure along arrow 304, the die 300 is subjected to tremendous compression. The inventors have developed certain dies which are able to withstand these forces and produce the desired refurbished targets.

The die 300 may be constructed of any suitable material capable of withstanding the applied forces. For example, the die 300 may be constructed of graphite. In one embodiment, the graphite is a high grade graphite, such as "grade 2124", available from Center Carbon Company. High grade graphite is generally characterized by low porosity and fine grain size. The die may be cut from a block of suitable graphite using well known lathe machinery. Some of the properties of several graphite grades are given below:

| Properties | Grade 2191 | Grade 2124 | Grade 2160 |
|---|---|---|---|
| Bulk Density | 1.74 g/cc | 1.80 g/cc | 1.86 g/cc |
| Average Grain Size | 15 | 12 | 5 |
| Flexural Strength (MPa) | 44 | 52 | 76 |
| Compressive Strength (MPa) | 97 | 112 | 167 |
| Tensile Strength (MPa) |  | 31 | 50 |
| Porosity (%) | 12 | 10 | 7 |
| Coefficient of Thermal Expansion (10-6/C.) | 4.2 | 5.0 | 6.0 |

Figure 4:
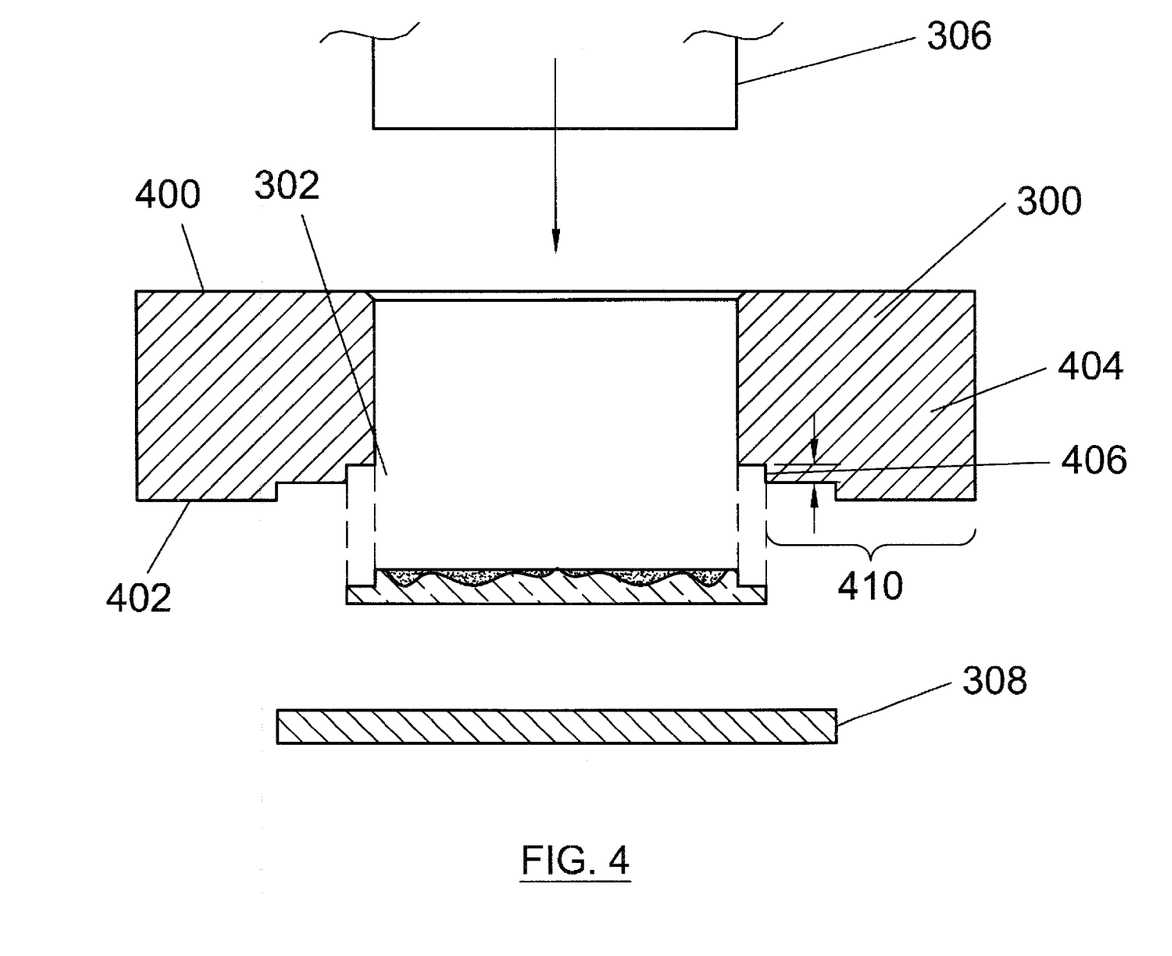
FIG. 4 is a schematic illustration of the die of FIG. 3B.

FIG. 4 shows a more detailed depiction of die 300. As shown in FIG. 4, die 300 has a top wall 400, a bottom wall 402, and sidewalls 404. Die 300 also has cavity 302 for receiving a sputtering target. The size and shape of cavity 302 is configured to securely mate with the desired size and shape of the target. When an axial force is applied in a direction perpendicular to top surface 400, the target is compressed between press 306 and surface 308 as bottom wall 402 abuts surface 308. When the axial force is applied, the inner sidewall 406 of cavity 302 experiences radial stress. The die 300 has a thickness 410 which is sufficiently thick to accommodate this radial stress. The thickness 410 is the distance between the inner sidewall 406 of cavity 302 and the sidewall 404 of the die 300.

Figure 5A:
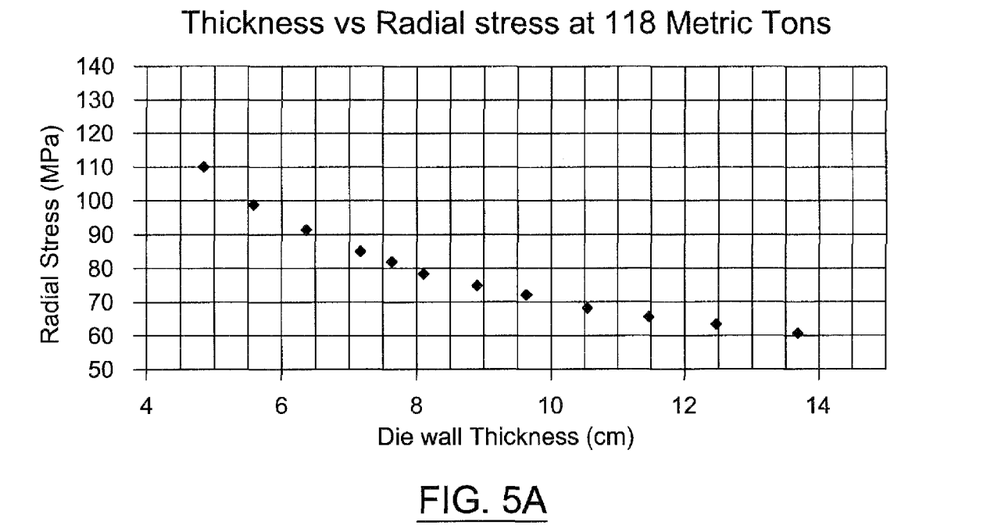
FIGS. 5A and 5B show graphs of the effect of die wall thickness on radial stress.
Figure 5B:
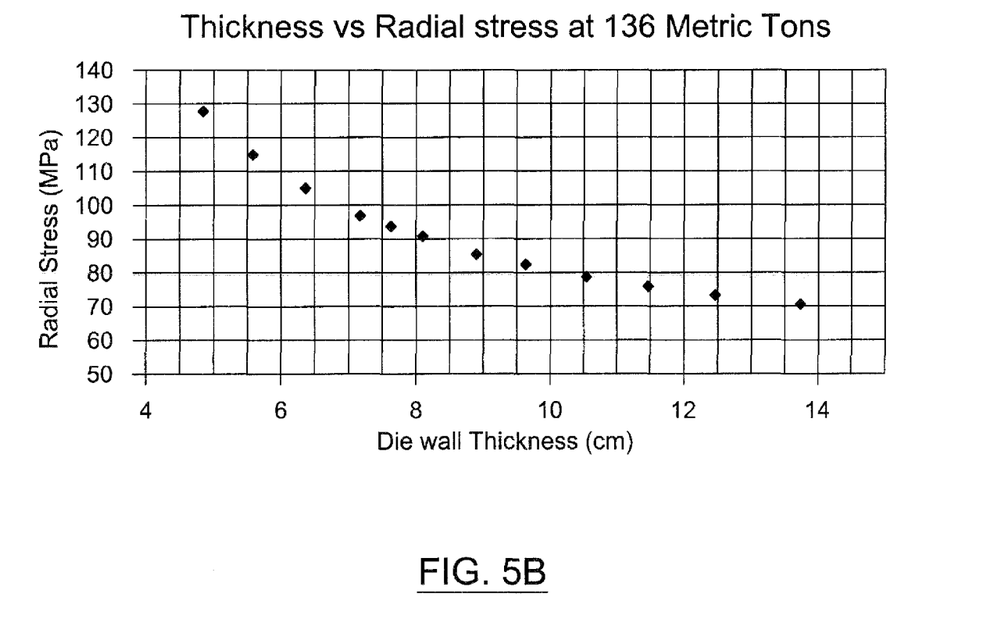

FIGS. 5A and 5B show graphs of the radial stress induced by a load being applied to a sputtering target with a top surface area of 73148 square millimeters. The radial stress at any radial distance (r), (where $P_i$ is the internal pressure, $P_0$ is the external pressure, and $r_0$ is the outer radius of the die, and $r_i$ is the inner radius of the die) may be calculated using the following formulas:

$$\sigma_2(r) = P_i r_i^2 - \frac{P_0 r_0^2}{(r_0^2 - r_i^2)} - \frac{r_i^2 r_0^2 (P_0 - P_i)}{r^2 (r_0^2 - r_i^2)}$$

$$\sigma_2(r_i) = \frac{P_i r_i^2}{(r_0^2 - r_i^2)} + \frac{r_i^2 r_0^2 P_i}{r_i^2 (r_0^2 - r_i^2)}$$

when $P_0 = 0$ and $r = r_i$ $$\sigma_3(r_i) = P_i \left( \left(\frac{r_0}{r_i}\right)^2 + \frac{1}{\left(\frac{r_0}{r_i}\right)^2} - 1 \right) = P_i \left( L^2 + \frac{1}{L^2 - 1} \right)$$

The thickness 410 (see FIG. 4) of the die wall was varied and the resulting stress was measured at various thicknesses. As the thickness of the walls of the die increases, the radial stress begins to drop dramatically at a constant force of 118 metric tons (see FIG. 5A). However, this effect diminishes until an asymptote can be established (in FIG. 5A, this appears to be approximately 11.4 centimeters for a target with a radius of about 90 millimeters and a thickness of about 7 millimeters). In FIG. 5B, a similar asymptote is seen at a thickness of approximately 11 centimeters.

Figure 6:
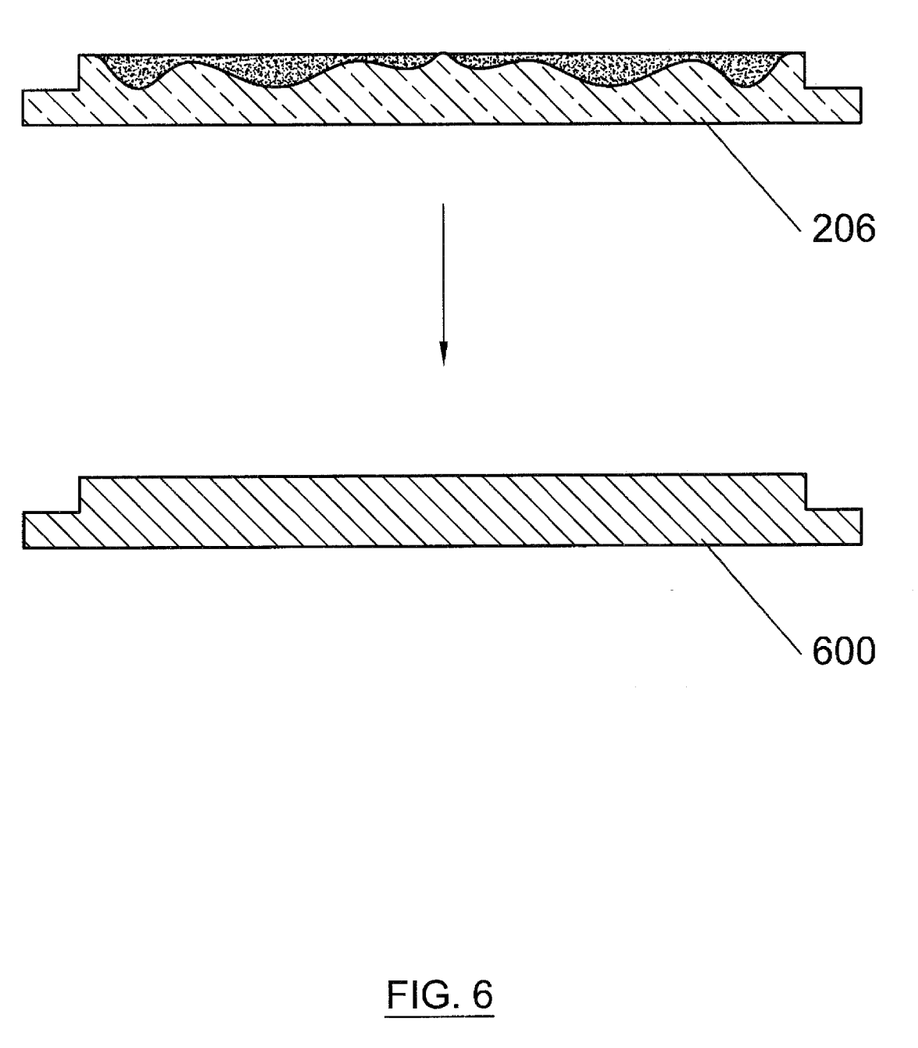
FIG. 6 shows the refurbishing of a filled sputtering target.

Referring again to FIG. 1, once the sputtering target has been disposed in the die (step 110) and the depleted regions are covered with fresh powder (step 112) then step 114 is executed, wherein the filled sputtering target is hot pressed such that the powdered metal fuses with the un-sputtered metal, producing a refurbished target. Reference may be had to FIG. 6.

FIG. 6 depicts filled sputtering target 206 before hot pressing and refurbished sputtering target 600 after hot pressing. Refurbished target 600 is substantially homogenous such that no interface can be observed by either optical microscopy or by scanning electron microscopy (see FIG. 7A). During the execution of step 114, both heat and axial pressure are applied for a certain period of time. The amount of heat, the amount of pressure, and the length of time varies depending on the composition of the target.

Figure 7A:
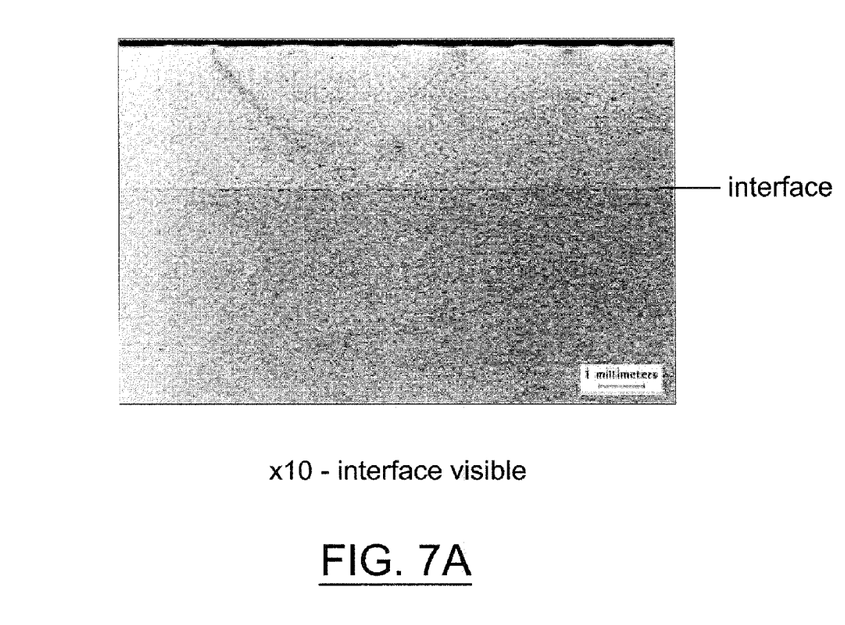
FIGS. 7A and 7B depict the profiles of two refurbished targets.
Figure 7B:
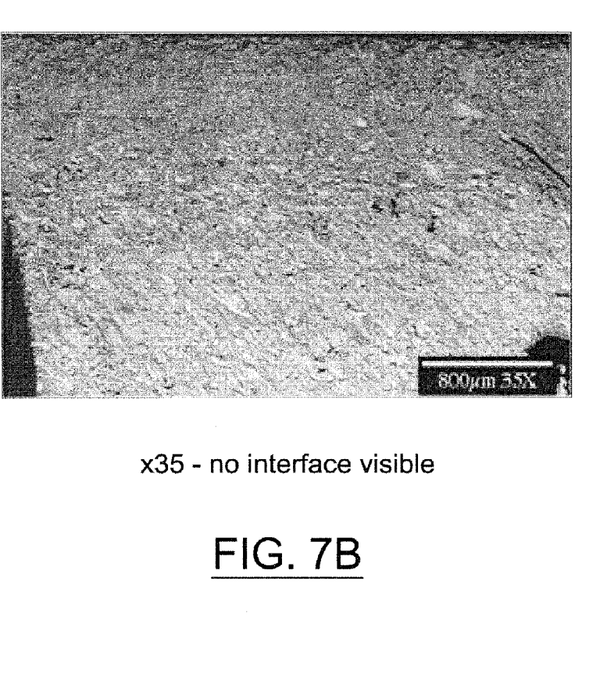

FIG. 7A and FIG. 7B show the profile of two refurbished ruthenium targets wherein no interface is visible in FIG. 7B. FIG. 8 shows the profile of a refurbished Co—Cr—Pt—B-Oxide target, which shows uniform distribution of the fine oxide phase in equilibrium with the gas atomized metallic phase.

The target depicted in FIG. 7A was produced using simple inert gas isostatic pressing at 20 MPa. A spent target of 5 cm diameter was placed in a 2191 grade graphite tool set. The amount of metal consumed by sputtering was replaced with fresh ruthenium powder (available from Johnson Matthey). The powder and the spent target assembly were then pressed at 1400° C., 20 MPa of pressure, soak time being 7 hours. The resulting target profile, shown in FIG. 7A, has a visible interface at the boundry between the original layer and the newly deposited layer.

In comparison, the target depicted in FIGS. 7B and 8 were produced in accordance with the teachings of this invention. Referring to FIG. 7B, the spent target (18.3 cm diameter) weighing 1790 g was placed in a specially designed graphite tool set (outer diameter being 43 cm with an O.D/I.D ratio of 2.36) such that the step of the target fits to the groove of the tool set and the sputtering zone is exposed to the top punch. The consumed amount (~775 g) of the target was refilled with baked ruthenium powder (purchased from Johnson Matthey). The top surface of the poured powder was then leveled by a measuring gauge and a flat scale. A barrier layer was placed between the top punch and the powder and used target bed. The entire tool set assembly is then placed in an inert gas hot pressing unit, which was purged with argon gas for 30 minutes to remove any unwanted oxygen present in the inert ambience. The powder and the spent target assembly was then hot pressed at 1400 (+50/−25)° C., 50 (±10) MPa of pressure, soak time being 7 (+3/−2) hours. Even at ×35 magnification, no interface is visible.

An additional example is shown in FIG. 8. A Co—Cr—Pt—B-Oxide target (19.05 cm diameter), weighing 1025 g was placed in a similarly designed graphite tooling (outer diameter being 45.7 cm with an O.D/I.D ratio of 2.368). The consumed amount (~661 g) of the target was filled with fresh powder. The top surface of the poured powder was then leveled by a measuring gauge and a flat scale. A barrier layer was placed between the top press and the powder and the spent target/powder assembly. The entire tool set assembly is then placed in an inert gas hot pressing unit, which was purged with argon gas for 30 minutes to remove any unwanted oxygen present in the inert ambience. The powder and the spent target assembly was then hot pressed at 1000 (+50/−25)° C., 50 (±10) MPa of pressure, soak time being 3 (±2) h. In this case, a minor discontinuity within the grain is observed at ×200 magnification, along the interface which is attributed to the presence of multi phase in the microstructure. However, no porosity or anomalous grain growth was observed in or around the interface.

The processing temperature range can vary anywhere within 1400° C. to about 1550° C. for ruthenium and that for the Co—Cr—Pt—B oxide can vary within 975-1050° C. Excessively low temperatures are characterized by insufficient diffusion to produce a homogenous target. Excessively high temperatures are characterized by anomalous grain growth and undesirable magnetic properties which also produces an inhomogeneous target. In one embodiment, the heating rate is approximately 20° C. per minute. The target is maintained at the final temperature for an extended period of time such as, for example, 7 hours. The pressure is maintained between about 40 MPa and 60 MPa.

While the invention has been described with reference to preferred embodiments, it will be understood by those skilled in the art that various changes may be made and equivalents may be substituted for elements thereof to adapt to particular situations without departing from the scope of the invention. Therefore, it is intended that the invention not be limited to the particular embodiments disclosed as the best mode contemplated for carrying out this invention, but that the invention will include all embodiments falling within the scope and spirit of the appended claims.

What is claimed is:

1. A process for refurbishing a spent sputtering target to restore it to its original form comprising the steps of:
   receiving a spent sputtering target comprised of an un-sputtered metal of a particular composition, wherein the spent sputtering target has a non-uniform depleted region on its top surface and a back surface opposite the depleted region,
   identifying a desired weight that corresponds to the weight of the spent sputtering target in an original form,
   determining the weight of the spent sputtering target,
   disposing the spent sputtering target within a hot press die that has a bottom wall such that the back surface of the target abuts the bottom wall,
   filling only the non-uniform depleted region with a powder of the metal, the powder having a particular composition that corresponds to the particular composition of the un-sputtered metal, the filling step being performed either before or after the step of disposing the sputtering target within the hot press die, thus producing a filled sputtering target with a layer of powder and an interface between the powder and depleted region, wherein the total weight of the powder and the spent sputtering target is substantially equal to the desired weight, and
   applying sufficient heat and uniaxial force in a direction perpendicular to the top surface of the depleted region while maintaining the temperature below that of the melting point of the metal to ensure solid state diffusion is the only mechanism taking place during the step of applying sufficient heat and uniaxial force to hot press the filled sputtering target such that the powdered metal sinters and bonds with the un-sputtered metal during a solid state diffusion process, thus restoring the spent target to the original form by homogenizing the interface and producing a homogenous refurbished target with the same porosity and anomalous grain growth throughout the refurbished target, thereby homogenizing the interface that existed before the step of applying sufficient heat and uniaxial force.

2. The process as recited in claim 1, wherein the powder includes a metal selected from the group consisting of ruthenium, platinum and rhodium.

3. The process as recited in claim 1, wherein the uniaxial force is applied with a top punch and a barrier layer is inserted between the top punch and the powder prior to the step of applying sufficient heat and uniaxial force.

4. The process as recited in claim 1, wherein the step of applying sufficient heat and uniaxial force is performed for a time period sufficient to sinter the powder and form a solid state diffusion bond with the spent sputtering target with the same porosity and anomalous grain growth at the interface between the un-sputtered metal and the sintered powder as found elsewhere in the refurbished target.

5. The process as recited in claim 1, wherein the powdered metal includes an alloy of at least two different metals, at least one of which is selected from ruthenium, platinum, and rhodium.

6. The process as recited in claim 1, wherein the powdered metal includes a metal oxide.

7. The process as recited in claim 1, wherein the powdered metal includes a Co—Cr—Pt—B-oxide.

8. A process for refurbishing a spent sputtering target to restore it to its original form comprising the steps of:
   receiving a spent sputtering target consisting essentially of an un-sputtered single metal of a particular composition, wherein the spent sputtering target has a non-uniform depleted region on its top surface and a back surface opposite the depleted region,
   identifying a desired weight that corresponds to the desired weight of the spent sputtering target in an original form,
   determining the weight of the spent sputtering target,
   measuring a metal powder such that the total weight of the powder and the spent sputtering target is substantially equal to the desired weight of the single refurbished target, wherein the metal powder consists essentially of the same single metal,
   disposing the spent sputtering target within a hot press die that has a bottom wall such that the back surface of the target abuts the bottom wall,
   filling only the non-uniform depleted region with the metal powder, the powder having a particular composition that corresponds to the particular composition of the un-sputtered metal, the filling step being performed either before or after the step of disposing the sputtering target within the hot press die, thus producing a filled sputtering target with a layer of powder and an interface between the powder and depleted region, wherein the total weight of the powder and the single spent sputtering target is substantially equal to the desired weight of the original target, and
   applying sufficient heat and uniaxial force in a direction perpendicular to the top surface of the depleted region while maintaining the temperature below that of the melting point of the metal to ensure solid state diffusion is the only mechanism taking place during the step of applying sufficient heat and uniaxial force to hot press the filled sputtering target such that the powdered metal sinters and bonds with the un-sputtered metal during a solid state diffusion process, thus restoring the spent target to the original form by homogenizing the interface and producing a homogenous refurbished target with the same porosity and anomalous grain growth throughout the refurbished target thereby homogenizing the interface that existed before the step of applying sufficient heat and uniaxial force.

9. The process as recited in claim 8, wherein the metal powder is selected from the group consisting of ruthenium, platinum, and rhodium.

10. A process for refurbishing a spent sputtering target to restore it to its original form comprising the steps of:
    receiving a spent sputtering target that consists essentially of un-sputtered ruthenium with a particular composition, wherein the spent sputtering target has a non-uniform depleted region on its top surface and a back surface opposite the depleted region,
    identifying a desired weight of a refurbished target that corresponds to the desired weight of the spent sputtering target in an original form,
    determining the weight of the spent sputtering target, measuring a sample that consists essentially of powdered ruthenium such that the total weight of the powdered ruthenium and the spent sputtering target is substantially equal to the desired weight of the refurbished target, disposing the spent sputtering target within a hot press die that has a bottom wall such that the back surface of the target abuts the bottom wall, filling only the non-uniform depleted region with the powdered ruthenium, either before or after the step of disposing the sputtering target within the hot press die, thus producing a filled sputtering target with a layer of powder and an interface between the powder and depleted region, wherein the total weight of the powder and the spent sputtering target is substantially equal to the desired weight of the original target, and applying heat of from about 1400° C. to about 1550° C. and uniaxial force of from about 40 MPa to about 60 MPa in a direction perpendicular to the top surface of the depleted region to hot press the filled sputtering target such that the powdered ruthenium sinters and bonds with the un-sputtered ruthenium, thus restoring the spent target to the original form by homogenizing the interface and producing a homogenous refurbished target with the same porosity and anomalous grain growth throughout the refurbished target thereby homogenizing the interface that existed before the step of applying sufficient heat and uniaxial force.

11. The process as recited in claim 10, wherein the step of applying heat causes the die to maintain a temperature of from about 1400° C. to about 1550° C. for a time period of from about 5 hours to about 10 hours.

12. The process as recited in claim 1, wherein the filled sputtering target is disposed in a cavity in the hot press die, the cavity circumscribed by a side wall, and the side wall having a thickness corresponding to an asymptote of the following function:

$$\sigma_3(r_i) = P_i \left( \left( \frac{r_0}{r_i} \right)^2 + \frac{1}{\left( \frac{r_0}{r_i} \right)^2} - 1 \right)$$

where $P_i$ is an internal pressure, $r_0$ is an outer radius of the hot press die, and $r_i$ is an inner radius of the die, wherein the thickness is the difference between $r_i$ and $r_0$.

13. The process as recited in claim 1, wherein the filled sputtering target is disposed in a cavity in the hot press die, the cavity having an inner diameter, the hot press die having an outer diameter, and the ratio of the outer diameter to the inner diameter being about 2.36.

* * * * *